United States Patent

Welty et al.

[15] 3,636,619

[45] Jan. 25, 1972

[54] FLIP CHIP INTEGRATED CIRCUIT AND METHOD THEREFOR

[72] Inventors: Joseph M. Welty, Los Altos Hills; Philip Shiota, San Francisco; Roger W. Murray, Palo Alto, all of Calif.

[73] Assignee: Teledyne, Inc., Mountain View, Calif.

[22] Filed: June 19, 1969

[21] Appl. No.: 836,219

[63] Continuation of Ser. No. 657,201, July 31, 1967.

[52] U.S. Cl. ..................................29/591, 317/235, 29/577

[51] Int. Cl. ..........................................B01j 17/00, H01l 1/14

[58] Field of Search .............................117/212; 29/577, 591

[56] References Cited

UNITED STATES PATENTS

| | | | |
|---|---|---|---|
| 3,324,357 | 6/1967 | Hill | 29/591 |
| 3,345,210 | 10/1967 | Wilson | 117/112 |
| 3,391,451 | 7/1968 | Moore | 29/577 |
| 3,513,022 | 5/1970 | Casterline et al. | 29/591 |

OTHER PUBLICATIONS

IBM Tech. Discl. Bul., " Fabrication of Tunnel Diode" by Im, Vol. 6, No. 2, July 1963, pages 94– 95

*Primary Examiner*—John F. Campbell
*Assistant Examiner*—W. Tupman
*Attorney*—Flehr, Hohbach, Test, Albritton & Herbert

[57] ABSTRACT

A flip chip integrated circuit having a raised contact pad for coupling to a substrate containing a printed circuit to which several chips are to be coupled. The raised contact pad is formed by etching a window in an active semiconductive region, depositing an aluminum mesa on the oxide passivating surface of a chip, and then evaporating an aluminum layer between the window and on top of the contact pad.

1 Claims, 6 Drawing Figures

INVENTORS
JOSEPH M. WELTY
PHILIP SHIOTA
BY ROGER W. MURRAY
Flehr, Hohbach, Test, Albritton & Herbert
ATTORNEYS

FLIP CHIP INTEGRATED CIRCUIT AND METHOD THEREFOR

The present invention is directed to a flip chip integrated circuit and method therefor and more particularly to the provision of raised contact pads for the flip chip.

The inverting of several passivated chip-type semiconductors onto a common ceramic substrate having printed leads thereon is an improved packaging concept. By this technique major packaging costs involving device mounting, hermetic sealing and interconnecting are reduced while improved reliability is achieved from the simplified interconnections.

In order to be "flippable" the ideal flip-type device must be single sided so that all terminals are available in one plane. In addition, the flip chip should have contact surfaces in the form of raised pads or bumps on its flip side. In the prior art the pads or bumps have been applied to thin-film leads which are in contact with the device. Generally, the leads are aluminum and the contact pads or bumps do not form an effective bond with them whereby there is a poor electrical connection between the pad or bump and the underlying lead.

It is therefore a general object of this invention to provide an improved flip chip integrated circuit and method therefor.

It is another object of the invention to provide a device and method as above in which the contact pads are formed in a relatively simple manner and provide a good electrical contact with the associated active semiconductive region.

Accordingly, the invention provides a method of forming a flip chip integrated circuit having raised contact pads which comprises the steps of exposing an inset semiconductive region of the chip, depositing a raised portion of the chip, and thereafter depositing on the chip a conductive layer connecting the raised portion with the exposed region. This layer which, for example, may be evaporated aluminum, forms the exterior contact surface of the raised portion and physically contacts the exposed semiconductive region.

From a device standpoint, the invention includes an integrated circuit on a semiconductive substrate which has a semiconductive region of predetermined conductivity in the substrate. A contact pad is affixed to this substrate, spaced from the semiconductive region, and raised above the surface of the substrate. A continuous deposited conductive layer couples the region to the pad. The conductive layer physically contacts the semiconductive inset region and forms the exterior contact surface of the raised pad.

These and other objects of the invention will become more clearly apparent from the following description.

Referring to the drawings.

Figure 5:
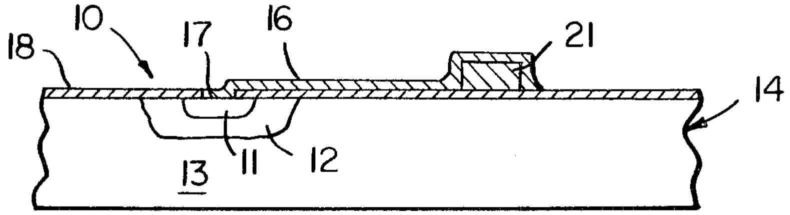
FIG. 5 is a cross-sectional view of the completed device.
Figure 6:
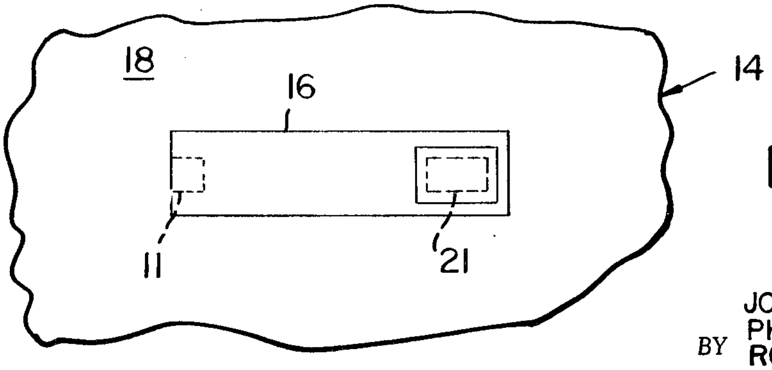
FIG. 6 is a fragmentary top view of FIG. 6.

FIGS. 5 and 6 illustrate a finished device embodying the present invention and is but a small portion of an overall semiconductive chip. A single active device, generally indicated at 10, is shown which has an emitter region 11, for example, of N-type conductivity, a base region 12 of P-type conductivity and a collector region 13 of N-type conductivity. The device is inset into a semiconductive substrate 14 which would normally be a portion of a semiconductive integrated circuit chip.

For purposes of simplification electrical contact is shown as only being made with active semiconductive region 11 by an evaporated aluminum strip 16 through a window 17 in silicon oxide passivating surface 18. But it should be understood that as many additional contacts as necessary can be made by the present invention.

A contact pad 21 is affixed to the substrate 14 on oxide surface 18 and is spaced from active region 11. The continuous deposited conductive layer 16 couples the active region 11 to pad 21. The conductive layer physically contacts inset region 11 through window 17 and forms the exterior contact surface of raised pad 21. Thus by the present construction a continuous unbroken electrical lead is formed between the pad and semiconductive region. Chip portion 14 may be flipped on top of a proper printed circuit base to interconnect it with other integrated circuits.

Figure 1:
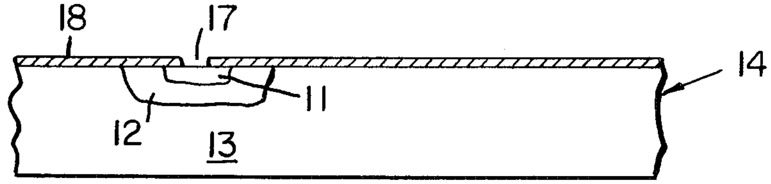
FIGS. 1 through 4 are simplified cross-sectional views of a semiconductive substrate which is a portion of an integrated chip showing the method embodying the present invention.

The method of forming the device of FIGS. 5 and 6 is shown in FIGS. 1 through 4. FIG. 1 is a completed transistor having regions 11, 12 and 13 with a passivating oxide surface 18. Window 17 has also been formed by proper masking and etching to expose inset region 11.

Figure 2:
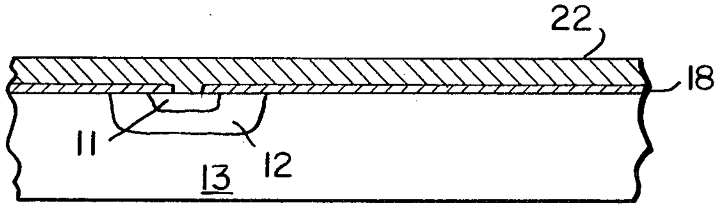
Figure 3:
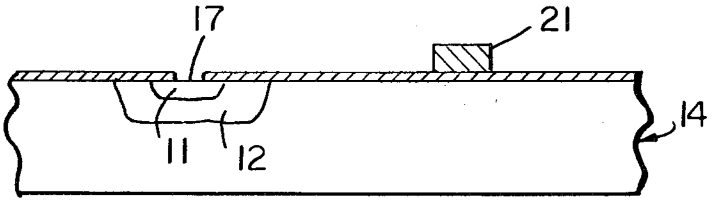
Figure 4:
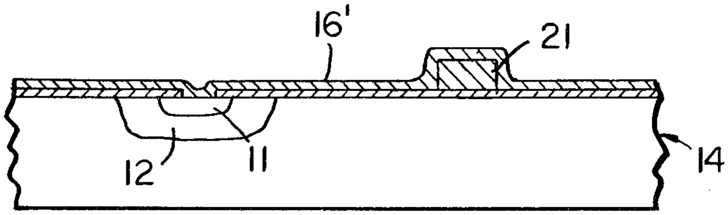

As shown in FIGS. 2 and 3, a relatively thick aluminum layer 22 is evaporated or deposited on oxide layer 18. Thereafter by a masking and etching process well known in the art a raised contact pad 21 remains (FIG. 3) which is affixed to the oxide surface layer 18 of substrate 14 and is spaced from inset semiconductive region 11. Window 17 remains open and free of any oxide since the aluminum deposition is carried on at temperatures of less than 150° C.

A relatively thin aluminum layer 16' is evaporated (FIG. 5) over the entire surface of the substrate covering the raised pad 21 and coupling it to inset region 11. Subsequently, by an etching process, the excess parts of evaporated layer 16' are removed to form the final conductive strip 16 coupling inset region 11 and forming the contact surface of the pad 21. The forming of conductive strip 16 by a single deposition ensures an electrical lead and contact pad of low resistance.

By the above process of forming the conductive strip 16 any intermediate bonding process is eliminated between the contact pad and the active semiconductive inset region and a continuous electrical lead is formed between the semiconductive region and contact pad. Thus good electrical contact of very low resistivity is assured. In addition, the surface passivation of the device has not been disturbed by the contact pad forming process; for example, the conductive strip 16 is an exterior layer of the device and requires no further processing or use of additional layers for structural and handling purposes. Finally, the process is simple and trouble free since the crucial contacts are formed in a single step.

We claim:

1. A method of forming a flip chip integrated circuit having raised contact pads and having a plurality of semiconductor devices inset into the chip comprising the following steps: forming an oxide passivating layer on said chip, exposing an inset semiconductive region of one of said semiconductor devices of said chip, forming a raised pad portion on said chip spaced from said exposed inset region by evaporating on said oxide layer a material different than such layer and thereafter removing all of such material except said pad portion which covers a small area relative to the area of said oxide layer, thereafter depositing on said chip in a single deposition a conductive layer connecting said raised portion with said exposed region, said layer forming the exterior contact surface of said raised portion and physically contacting said exposed region whereby said raised exterior contact surface may be flipped on a printed circuit.

* * * * *